(12) United States Patent
Nakashiba (10) Patent No.: US 8,779,595 B2
(45) Date of Patent: Jul. 15, 2014

(54) SEMICONDUCTOR DEVICE HAVING HIGH-FREQUENCY INTERCONNECT

(71) Applicant: Renesas Electronics Corporation, Kanagawa (JP)

(72) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/871,448

(22) Filed: Apr. 26, 2013

(65) Prior Publication Data

US 2013/0234286 A1 Sep. 12, 2013

Related U.S. Application Data

(62) Division of application No. 12/046,490, filed on Mar. 12, 2008, now abandoned.

(30) Foreign Application Priority Data

Mar. 12, 2007 (JP) .................................. 2007-61990

(51) Int. Cl.
- *H01L 23/52* (2006.01)
- *H01L 23/48* (2006.01)
- *H01L 29/40* (2006.01)
- *H01L 29/00* (2006.01)

(52) U.S. Cl.
USPC ..... 257/758; 257/773; 257/531; 257/E23.141

(58) Field of Classification Search
USPC ........................... 257/531, 758, 773, E23.141
See application file for complete search history.

(56) References Cited

U.S. PATENT DOCUMENTS

| | | | |
|---|---|---|---|
| 6,258,715 B1 | 7/2001 | Yu et al. | 438/648 |
| 6,522,007 B2 | 2/2003 | Kouno et al. | |
| 6,730,983 B2 | 5/2004 | Minami | |
| 7,161,248 B2 | 1/2007 | Karasawa et al. | |
| 7,211,897 B2 | 5/2007 | Yamanoue | |
| 7,479,701 B2* | 1/2009 | Landis | 257/758 |
| 2003/0098496 A1* | 5/2003 | Sugiyama et al. | 257/531 |
| 2005/0127496 A1* | 6/2005 | Kwon et al. | 257/700 |

(Continued)

FOREIGN PATENT DOCUMENTS

| | | |
|---|---|---|
| CN | 1677661 A | 10/2005 |
| JP | 2002-110908 | 4/2002 |

(Continued)

OTHER PUBLICATIONS

Design Issues in CMOS Differential LC Oscillators, Ali Hajimiri et al., p. 717-724, IEEE Journal of Solid-State Circuits, vol. 34. No. 5, May 1999.

(Continued)

*Primary Examiner* — Luan C Thai
(74) *Attorney, Agent, or Firm* — Young & Thompson (57) ABSTRACT

Provided is a semiconductor device including high-frequency interconnect and dummy conductor patterns (second dummy conductor patterns). The dummy conductor patterns are disposed in a interconnect layer different from a interconnect layer in which the high-frequency interconnect is disposed. The dummy conductor patterns are disposed so as to keep away from a region overlapping the high-frequency interconnect in plan view. The semiconductor device further includes dummy conductor patterns (first dummy conductor patterns) in the interconnect layer in which the high-frequency interconnect is disposed.

20 Claims, 13 Drawing Sheets

(56) References Cited

U.S. PATENT DOCUMENTS

| | | | |
|---|---|---|---|
| 2005/0212136 A1 | 9/2005 | Karasawa et al. | |
| 2006/0118960 A1 | 6/2006 | Landis | 257/758 |
| 2006/0163692 A1 | 7/2006 | Detecheverry et al. | |

FOREIGN PATENT DOCUMENTS

| | | |
|---|---|---|
| JP | 2002-373896 | 12/2002 |
| JP | 2004-153015 A | 5/2004 |
| JP | 2005-285970 | 10/2005 |
| JP | 2005-312303 | 11/2005 |
| JP | 2006-528837 | 12/2006 |

OTHER PUBLICATIONS

Chinese Office Action issued Jul. 13, 2010 in corresponding Chinese Application No. 200810083754.2 and its English translation.

Decision on Rejection issued May 4, 2012 by Patent Office of the People's Republic of China in corresponding Chinese Patent Application No. 200810083754.2 with English translation, 7 pages.

Notification of Reasons for Refusal dated Oct. 2, 2012 issued by the Japanese Patent Office in corresponding Japanese Patent Application No. 2008-059466 with full translation, 5 pages.

Official Action from Japanese Patent Office issued Nov. 5, 2013; Patent Application No. 2013-003162 with partial English translation.

* cited by examiner

SEMICONDUCTOR DEVICE HAVING HIGH-FREQUENCY INTERCONNECT

BACKGROUND OF THE INVENTION

1. Field of the Invention

The present invention relates to a semiconductor device, and more particularly, to a semiconductor device having a high-frequency interconnect and dummy conductor patterns.

2. Description of the Related Art

Figure 7:
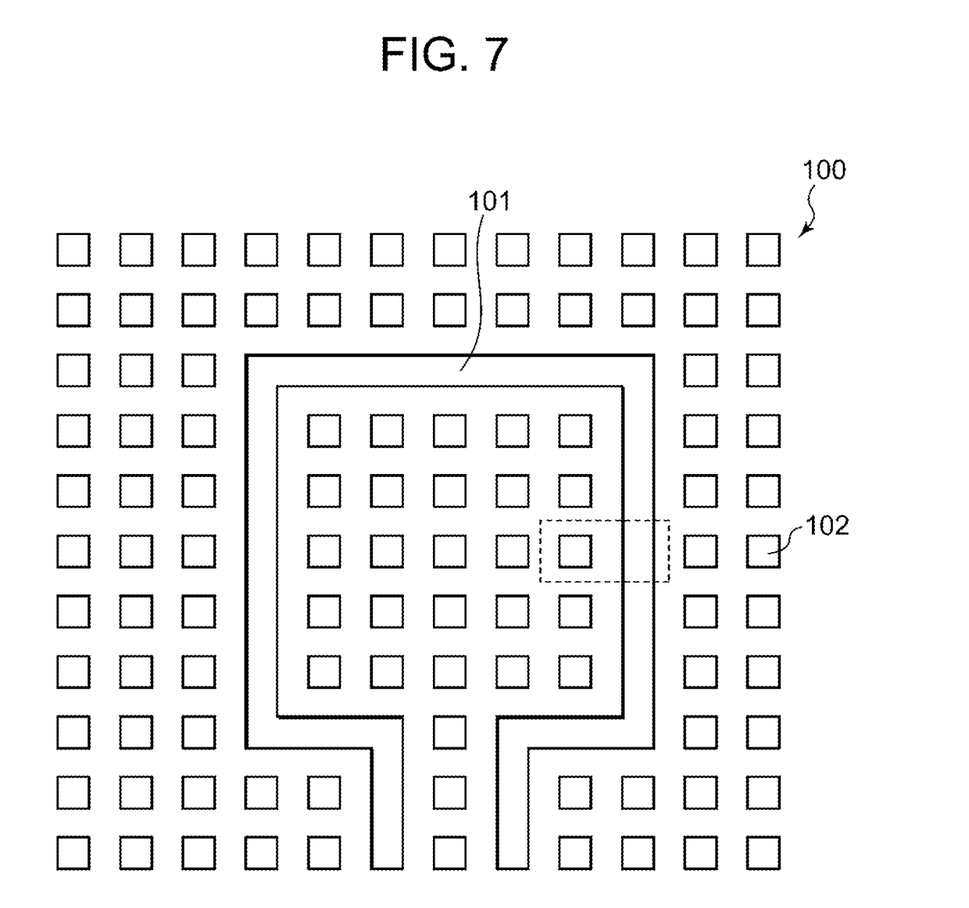
FIG. 7 is a plan view showing a semiconductor device according to a related art.
Figure 8:
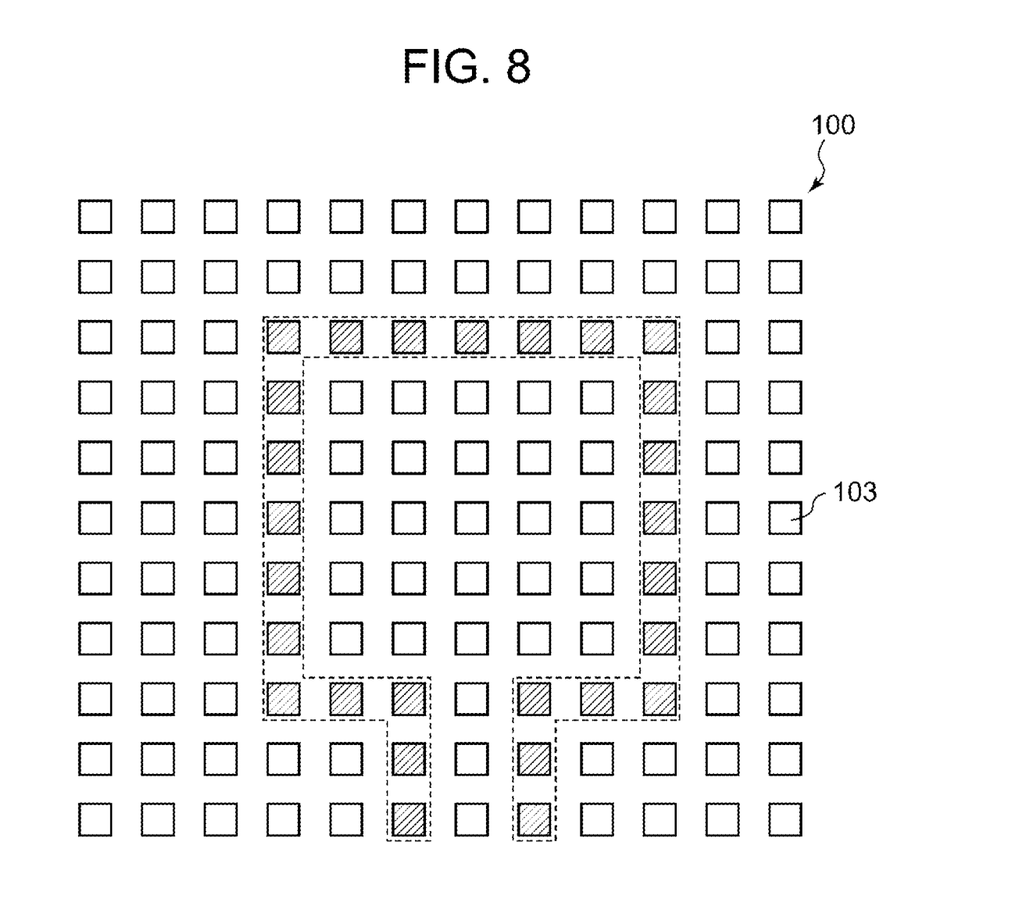
FIG. 8 is a plan view showing the semiconductor device according to the related art.

FIGS. 7 and 8 are plan views each showing a semiconductor device according to a related art. In a semiconductor device 100, dummy conductor patterns 102 and 103 are disposed near a high-frequency interconnect 101. FIG. 7 shows a layer in which the high-frequency interconnect 101 is formed, and FIG. 8 shows another layer. In FIG. 8, a region overlapping the high-frequency interconnect 101 in a plan view is indicated by the dotted line.

The dummy conductor patterns 102 are disposed in the same layer as that of the high-frequency interconnect 101, and the dummy conductor patterns 103 are disposed in a layer different from the layer in which the high-frequency interconnect 101 is disposed. The dummy conductor patterns are disposed for the purpose of preventing a dishing, which is called erosion, from being easily generated in a region, in which a interconnect pattern density is low, during a chemical mechanical polishing (CMP) process. In other words, when the dummy conductor patterns 102 are disposed, a layer containing the high-frequency interconnect 101 is easily processed at the time of production of the semiconductor device 100. The dummy conductor patterns 103 are also disposed for the same reason. Further, the high-frequency interconnect 101 functions as an inductor.

The related arts of the present invention are disclosed in JP 2005-285970 A and Ali Hajimiri et al., "Design Issues in CMOS Differential LC Oscillators", IEEE JOURNAL OF SOLID-STATE CIRCUITS, Vol. 34, No. 5, May 1999, pp. 717-724.

Figure 9:
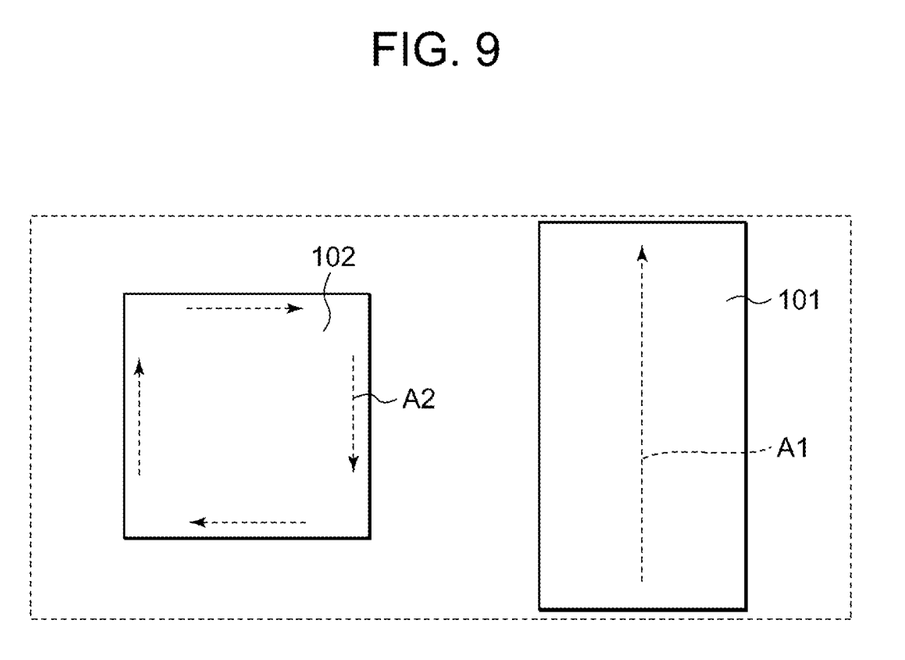
FIG. 9 is a plan view for explaining a problem of the semiconductor device according to the related art.

However, in the semiconductor device 100, in a case where a high-frequency current flows through the high-frequency interconnect 101, the following problem arises. That is, as shown in FIG. 9, due to a magnetic field generated by the high-frequency interconnect 101, an eddy current is generated in the dummy conductor patterns 102 which are positioned near the high-frequency interconnect 101. FIG. 9 is an enlarged plan view showing a portion surrounded by the dotted line of FIG. 7. In FIG. 9, an arrow A1 indicates a direction of the current flowing through the high-frequency interconnect 101, and an arrow A2 indicates a direction of the eddy current flowing through each of the dummy conductor patterns 102.

When the eddy current is generated as described above, according to Lenz's law, a magnetic field is generated in a direction in which the above-mentioned magnetic field is offset. Accordingly, a circuit constant of the high-frequency interconnect 101 fluctuates, which results in a change in transmission characteristics of the high-frequency interconnect 101.

The eddy current generated due to an effect of the magnetic field of the high-frequency interconnect 101 is generated not only in each of the dummy conductor patterns 102 disposed in the same layer as that of the high-frequency interconnect 101, but also in each of the dummy conductor patterns 103 disposed in another layer different from the layer in which the high-frequency interconnect 101 is disposed. The dummy conductor patterns 103 which are positioned closest to the high-frequency interconnect 101, that is, the dummy conductor patterns 103 (indicated by oblique lines of FIG. 8) which are positioned immediately above or immediately below the high-frequency interconnect are most significantly affected by the magnetic field of the high-frequency interconnect 101 in the different layer.

SUMMARY OF THE INVENTION

According to the present invention, there is provided a semiconductor device including: high-frequency interconnect disposed in a first layer in an interconnect layer; and dummy conductor patterns disposed in a second layer which is different from the first layer in the interconnect layer, in which the dummy conductor patterns are disposed so as to keep away from a region overlapping an entire portion of the high-frequency interconnect in plan view.

In the semiconductor device, the dummy conductor patterns are disposed in the second layer so as to keep away from the region overlapping the entire portion of the high-frequency interconnect. The dummy conductor patterns are not disposed in the region which is most likely to be affected by a magnetic field generated by the high-frequency interconnect in the second layer, thereby making it possible to suppress an eddy current to be generated in each of the dummy conductor patterns in the second layer.

According to the present invention, a semiconductor device capable of suppressing the eddy current generated in each of the dummy conductor patterns disposed in the layer different from that of the high-frequency interconnect is realized.

DETAILED DESCRIPTION OF THE PREFERRED EMBODIMENTS

Hereinafter, referring to the accompanying drawings, a preferred embodiment of the present invention will be described in detail. Note that, in the description of the drawings, the same components are denoted by the same reference symbols, and a repeated explanation thereof is omitted.

First Embodiment

Figure 1:
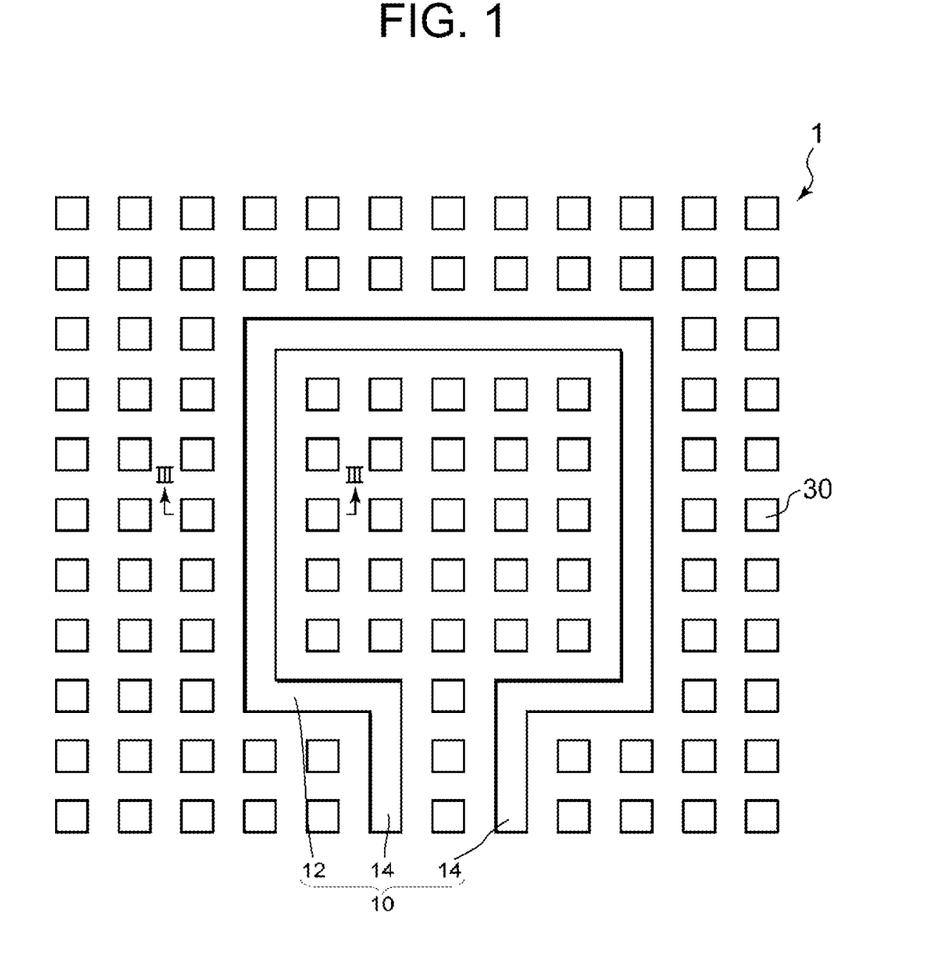
FIG. 1 is a plan view showing a semiconductor device according to a first embodiment of the present invention.
Figure 2:
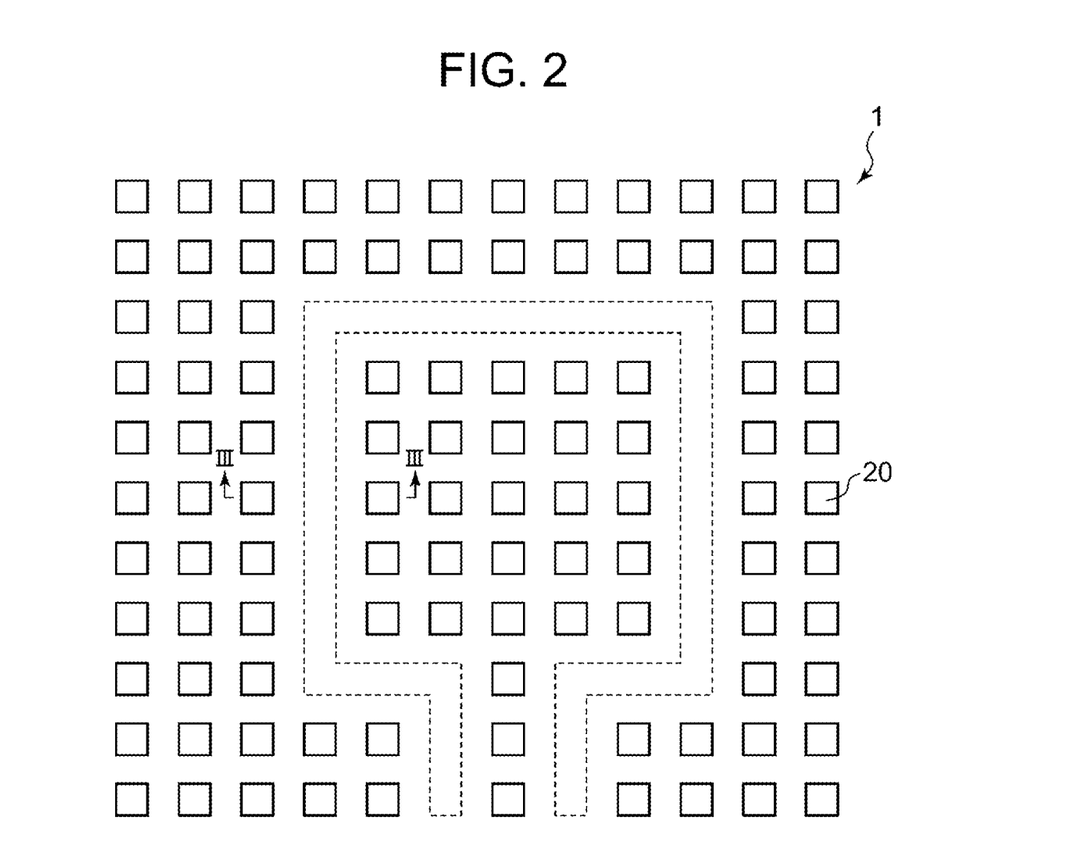
FIG. 2 is a plan view showing the semiconductor device according to the first embodiment of the present invention.

FIGS. 1 and 2 are plan views each showing a semiconductor device according to a first embodiment of the present invention. A semiconductor device 1 includes a high-frequency interconnect 10 and dummy conductor patterns 20 (second dummy conductor patterns). Through the high-frequency interconnect 10, a current with a frequency of 5 GHz or higher, for example, flows. The high-frequency interconnect 10 includes an interconnect, which is formed in a coil shape and functions as an inductor 12. The high-frequency interconnect 10 further includes extraction interconnects 14, which are connected to the coil-shaped inductor 12.

A plurality of dummy conductor patterns 20 are disposed near the high-frequency interconnect 10. Note that the dummy conductor patterns 20 are disposed in a layer different from that of the high-frequency interconnect 10. A layer (first layer) in which the high-frequency interconnect 10 is disposed, and a layer (second layer) in which the dummy conductor patterns 20 are disposed are shown in FIGS. 1 and 2, respectively. In this embodiment, the second layer is a layer adjacent to the first layer, that is, a layer disposed immediately above or immediately below the first layer. In this case, the dummy conductor patterns are conductor patterns, presence or absence of which does not affect a circuit configuration of the semiconductor device 1.

In FIG. 2, a region overlapping an entire portion of the high-frequency interconnect 10 in a plan view is indicated by the dotted line. As apparent from FIG. 2, the dummy conductor patterns 20 are disposed so as to keep away from the region overlapping the high-frequency interconnect 10 in a plan view.

The dummy conductor patterns 20 are disposed on both sides of the high-frequency interconnect 10 in a plan view. In this embodiment, the high-frequency interconnect 10 is formed in a coil shape as described above. Accordingly, the dummy conductor patterns 20 are disposed on both of an inner side and an outer side of a region surrounded by the high-frequency interconnect 10 in plan view.

As shown in FIG. 1, a plurality of dummy conductor patterns (first dummy conductor patterns) are disposed near the high-frequency interconnect 10 in the first layer. The dummy conductor patterns 30 are also disposed on both sides of the high-frequency interconnect 10, that is, disposed on both of the inner side and the outer side of a region surrounded by the high-frequency interconnect 10.

The dummy conductor patterns 20 and 30 are each made of the same material as that of the high-frequency interconnect 10. As the material, copper, aluminum, and the like may be used. In a case where the material of each of the high-frequency interconnect 10 and the dummy conductor patterns 20 and 30 is copper, the high-frequency interconnect 10 and the dummy conductor patterns 20 and 30 are disposed by, for example, a damascene process. The high-frequency interconnect 10 and the dummy conductor patterns 30 are preferably disposed simultaneously.

Figure 3A:
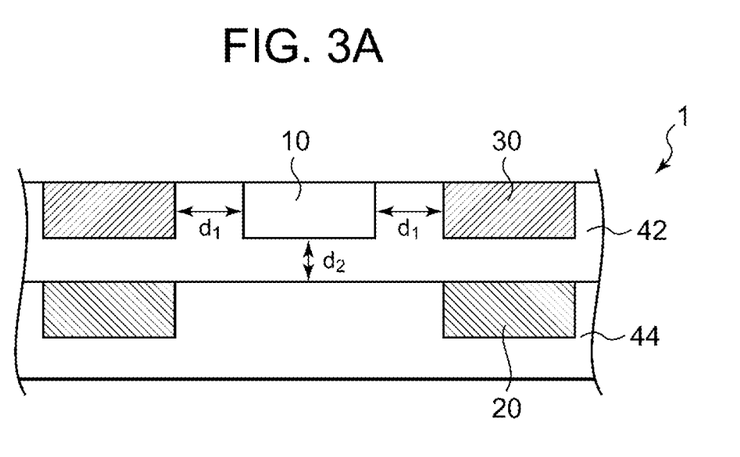
FIG. 3A is a cross-sectional diagram of the semiconductor device taken along the line of FIG. 1.
Figure 3B:
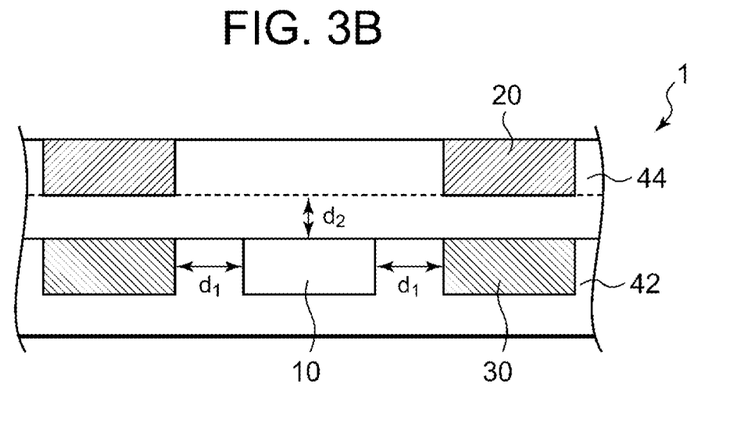
FIG. 3B is a cross-sectional diagram of the semiconductor device taken along the line of FIG. 2.

FIGS. 3A and 3B are cross-sectional diagrams each showing the semiconductor device taken along the line of FIGS. 1 and 2. In FIG. 3A, a case where a second layer 44 is disposed immediately below a first layer 42 is illustrated. In FIG. 3B, a case where the second layer 44 is disposed immediately above the first layer 42 is illustrated. As apparent from FIGS. 3A and 3B, in this embodiment, a minimum value $d_1$ of a distance between each of the dummy conductor patterns 30 and the high-frequency interconnect 10 is larger than a distance $d_2$. In FIG. 3A, the distance $d_2$ is equal to a distance between a plain surface containing top surfaces of the dummy conductor patterns 20 and the high-frequency interconnect 10. In FIG. 3B, the distance $d_2$ is equal to a distance between a plain surface containing bottom surfaces of the dummy conductor patterns 20 and the high-frequency interconnect 10. In recent years, the distance $d_2$ tends to be further shortened.

Effects of the embodiment of the present invention will be described. In the semiconductor device 1, the dummy conductor patterns 20 are disposed in a layer (second layer) different from that of the high-frequency interconnect 10 so as to keep away from the region overlapping the entire portion of the high-frequency interconnect 10. The dummy conductor patterns 20 are prevented from being disposed in a region which is most likely to be affected by the magnetic field of the high-frequency interconnect 10 in the second layer, thereby making it possible to suppress an eddy current generated in each of the dummy conductor patterns 20 in the second layer.

On the other hand, JP 2005-285970 A discloses a semiconductor device in which dummy conductor patterns are disposed in a region overlapping interconnect (specifically, extraction interconnect of inductor) in plan view. In the semiconductor device with that structure, when a high-frequency current flows through the interconnect, a large eddy current is generated in each of the dummy conductor patterns positioned immediately below the interconnect.

In the embodiment of the present invention, the dummy conductor patterns 30 are further disposed in the same layer (first layer) as that of the high-frequency interconnect 10. As a result, as compared with a case where the dummy conductor patterns 30 are not disposed, flatness can be easily obtained in the CMP process for the layer containing the high-frequency interconnect 10. In addition, the dummy conductor patterns 30 are disposed on both sides of the high-frequency interconnect 10. Accordingly, the CMP process for the layer containing the high-frequency interconnect 10 can be performed much easier than a case where the dummy conductor pattern 30 are disposed only on one side of the high-frequency interconnect 10.

In the embodiment of the present invention, the high-frequency interconnect 10 serves as an inductor. In this case, a magnetic field in a direction in which the magnetic field of the inductor is offset is generated by the eddy current, with the result that the magnitude of the magnetic field of the inductor is reduced. The reduction in magnitude of the magnetic field leads to deterioration in Q value of the inductor. In this regard, according to the embodiment of the present invention, the eddy current can be suppressed as described above, thereby making it possible to suppress the deterioration in Q value.

The above-mentioned problem, that is, the problem in that the circuit constant of the high-frequency interconnect 10 fluctuates due to the eddy current generated in each of the dummy conductor patterns 20, becomes significant when a current with a frequency of 5 GHz or higher flows through the high-frequency interconnect 10. Accordingly, particularly in this case, the utility of the embodiment of the present invention capable of suppressing the eddy current generated in each of the dummy conductor patterns 20 is increased.

Figure 4A:
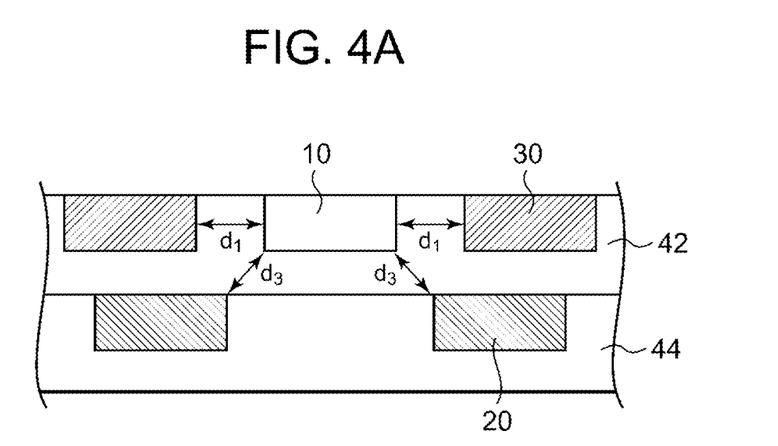
FIG. 4A is a cross-sectional diagram showing a semiconductor device according to a modified example of the first embodiment of the present invention.
Figure 4B:
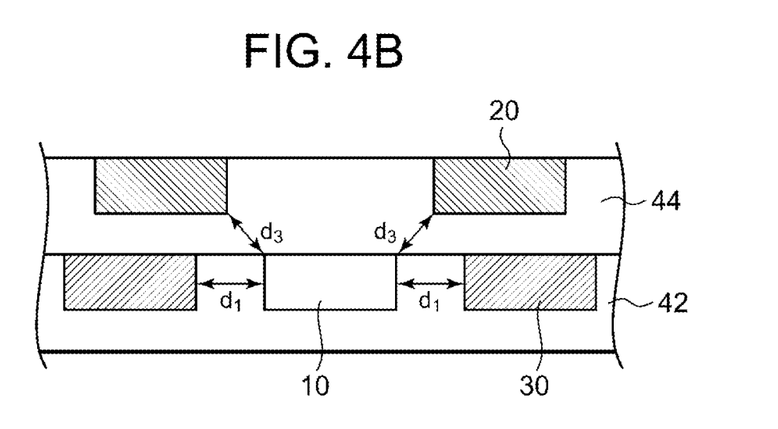
FIG. 4B is a cross-sectional diagram showing the semiconductor device according to the modified example of the first embodiment of the present invention.

Further, the above-mentioned problem becomes significant also when the minimum value $d_1$ of the distance between each of the dummy conductor patterns 30 and the high-frequency interconnect 10 is lager than the distance $d_2$ (see FIG. 3A or 3B). This is because, in this case, if the dummy conductor patterns 20 exist in the region overlapping the high-frequency interconnect 10, the distance between each of the dummy conductor patterns 20 and the high-frequency interconnect 10 becomes small. For the same reason, as shown in FIGS. 4A and 4B, when the minimum value $d_1$ is larger than a minimum value $d_3$ of a distance between each of the dummy conductor patterns 20 and the high-frequency interconnect 10, the above-mentioned problem becomes more significant. Accordingly, also in those cases, the utility of the embodiment of the present invention is increased.

Figure 5:
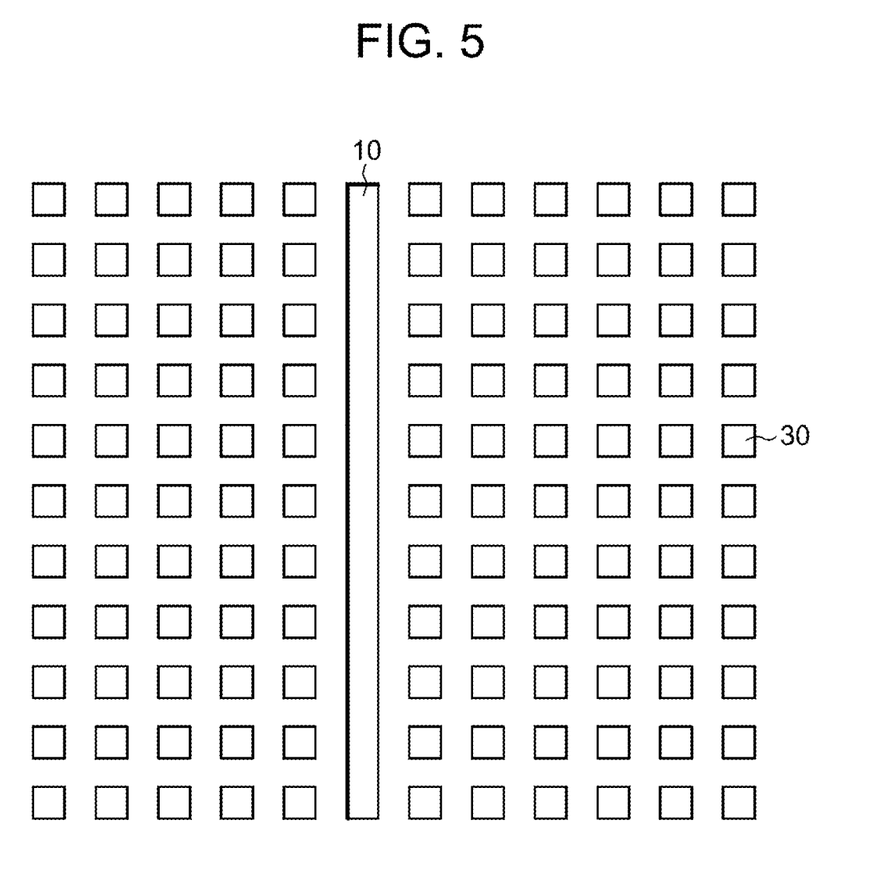
FIG. 5 is a plan view of a semiconductor device according to another modified example of the first embodiment of the present invention.
Figure 6:
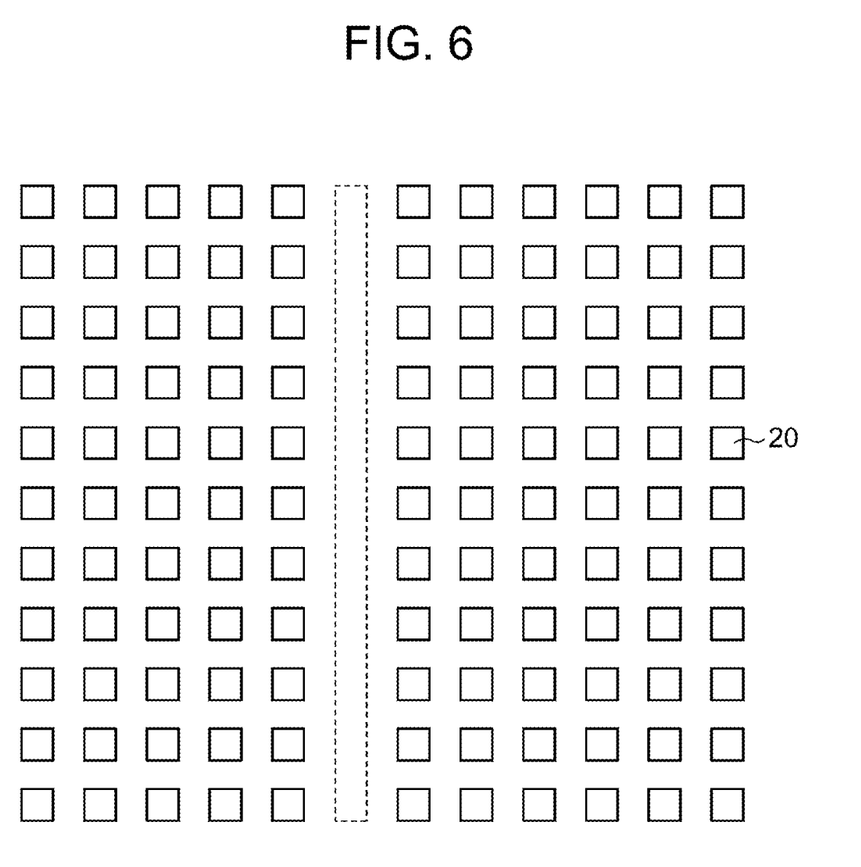
FIG. 6 is a plan view of the semiconductor device according to the another modified example of the first embodiment of the present invention.

The present invention is not limited to the above embodiment, and various modifications can be made. In the above embodiment, the case where the high-frequency interconnect 10 serves as an inductor is illustrated. Alternatively, atypical high-frequency interconnect may be used as the high-frequency interconnect 10. An example of that case is illustrated in FIGS. 5 and 6. FIG. 5 shows a layer in which the high-frequency interconnect 10 is disposed, and FIG. 6 shows a layer in which the dummy conductor patterns 20 are disposed. In FIG. 6, a region overlapping the high-frequency interconnect 10 in plan view is indicated by the dotted line. Also in FIGS. 5 and 6, the dummy conductor patterns 20 are disposed so as to keep away from the region overlapping the high-frequency interconnect 10 in plan view.

Second Embodiment

Figure 10:
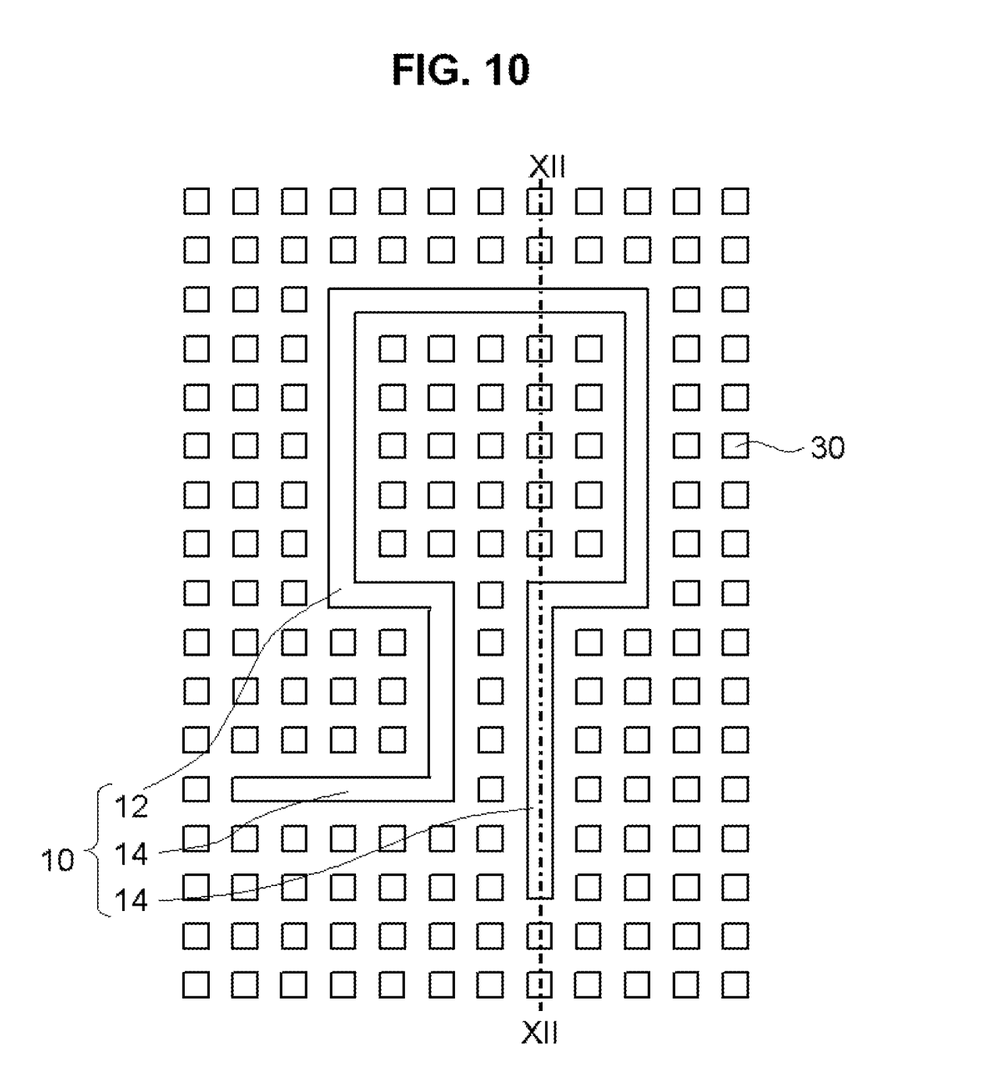
FIG. 10 a plan view showing a semiconductor device according to a second embodiment of the present invention.
Figure 11:
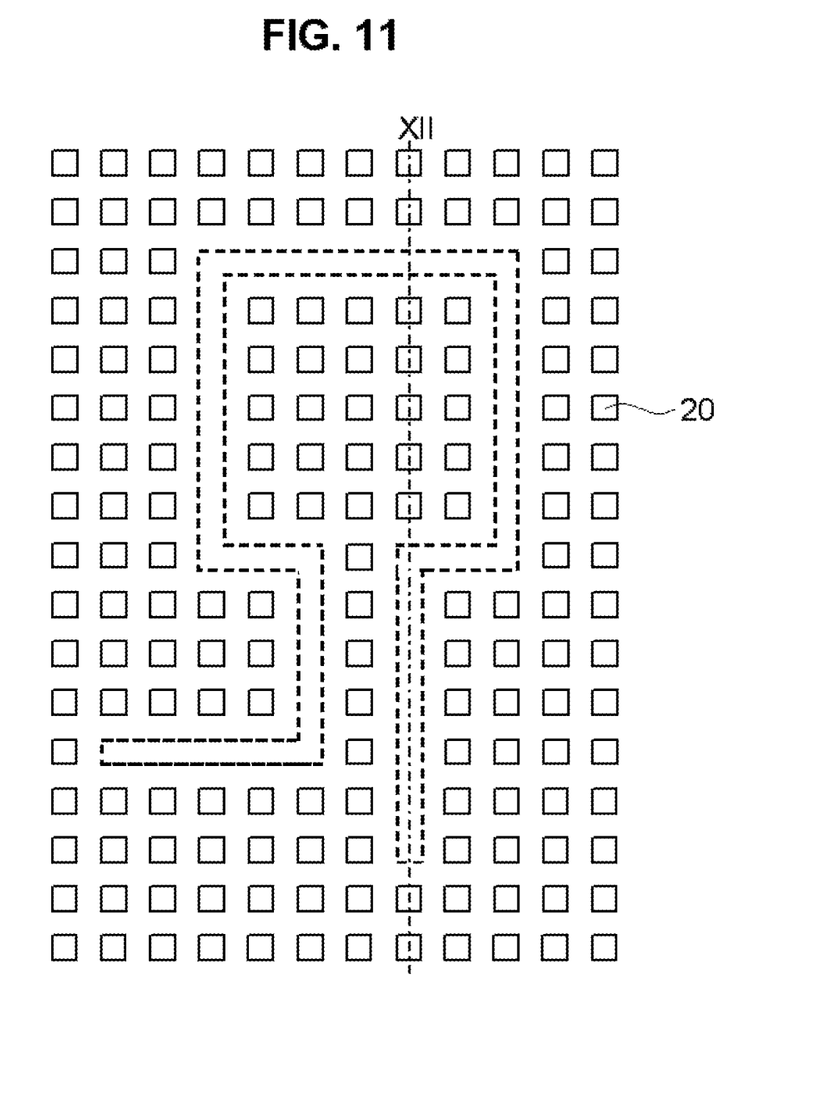
FIG. 11 a plan view showing the semiconductor device according to the second embodiment of the present invention.

FIGS. 10 and 11 are plan views each showing a semiconductor device according to a second embodiment of the present invention. In this embodiment, a layer shown in FIG. 11 (second layer) is disposed immediately below a layer shown in FIG. 10 (first layer). A semiconductor device of the second embodiment includes a high-frequency interconnect 10 and dummy conductor patterns 20 (second dummy conductor patterns). Through the high-frequency interconnect 10, a current with a frequency of 5 GHz or higher, for example, flows. The high-frequency interconnect 10 includes an interconnect, which is formed in a coil shape and functions as an inductor 12. The high-frequency interconnect 10 further includes an extraction interconnect 14. One end of the extraction interconnect 14 is connected to the coil-shaped inductor 12. Another end of the extraction interconnect 14 is connected to, for example, an electrode pad, or a source/drain region of a transistor.

Figure 12:
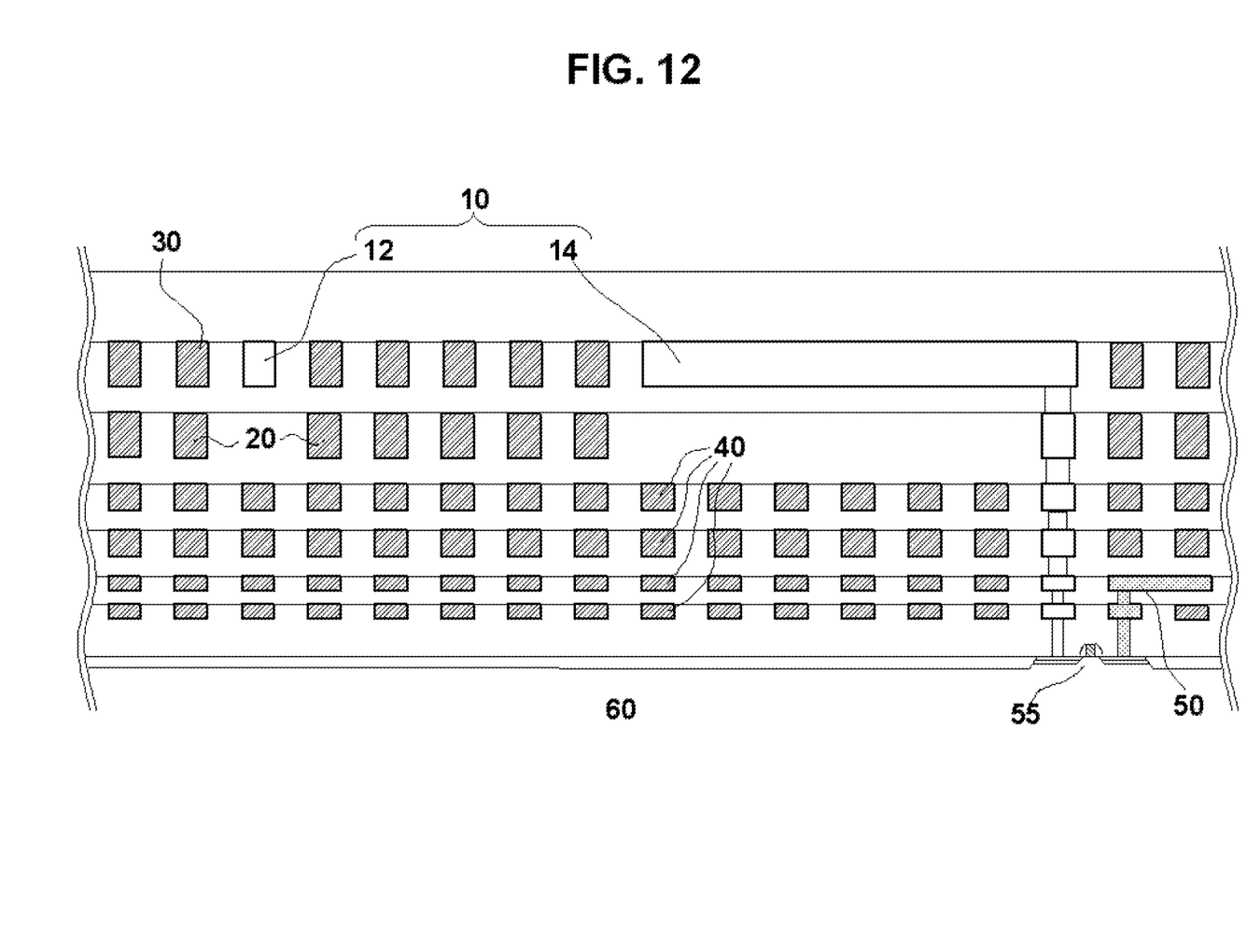
FIG. 12 is a cross-sectional diagram of the semiconductor device taken along the line XII-XII of FIG. 10 and FIG. 11.

FIG. 12 is a cross-sectional diagram of the semiconductor device taken along the line III-III of FIG. 10 and FIG. 11. In this embodiment, one end of the extraction interconnect 14 is connected to the inductor, and another end of the extraction interconnect 14 is connected to a source/drain region of a transistor 55, which is formed on a semiconductor substrate 60, through a plurality of vias, as shown in FIG. 12. In a second layer, the dummy conductor patterns are disposed so as to keep away from regions overlapping an entire portion of the high-frequency interconnect 10, which includes the inductor 12 and the extraction interconnect 14. A source/drain is also connected to a interconnect 50. In this embodiment, through the interconnect 50, a current with a frequency lower than 5 GHz, for example, flows. Therefore, the dummy conductor patterns 40 are disposed in a layer immediately above and below a layer the interconnect 50 is formed in.

Figure 13:
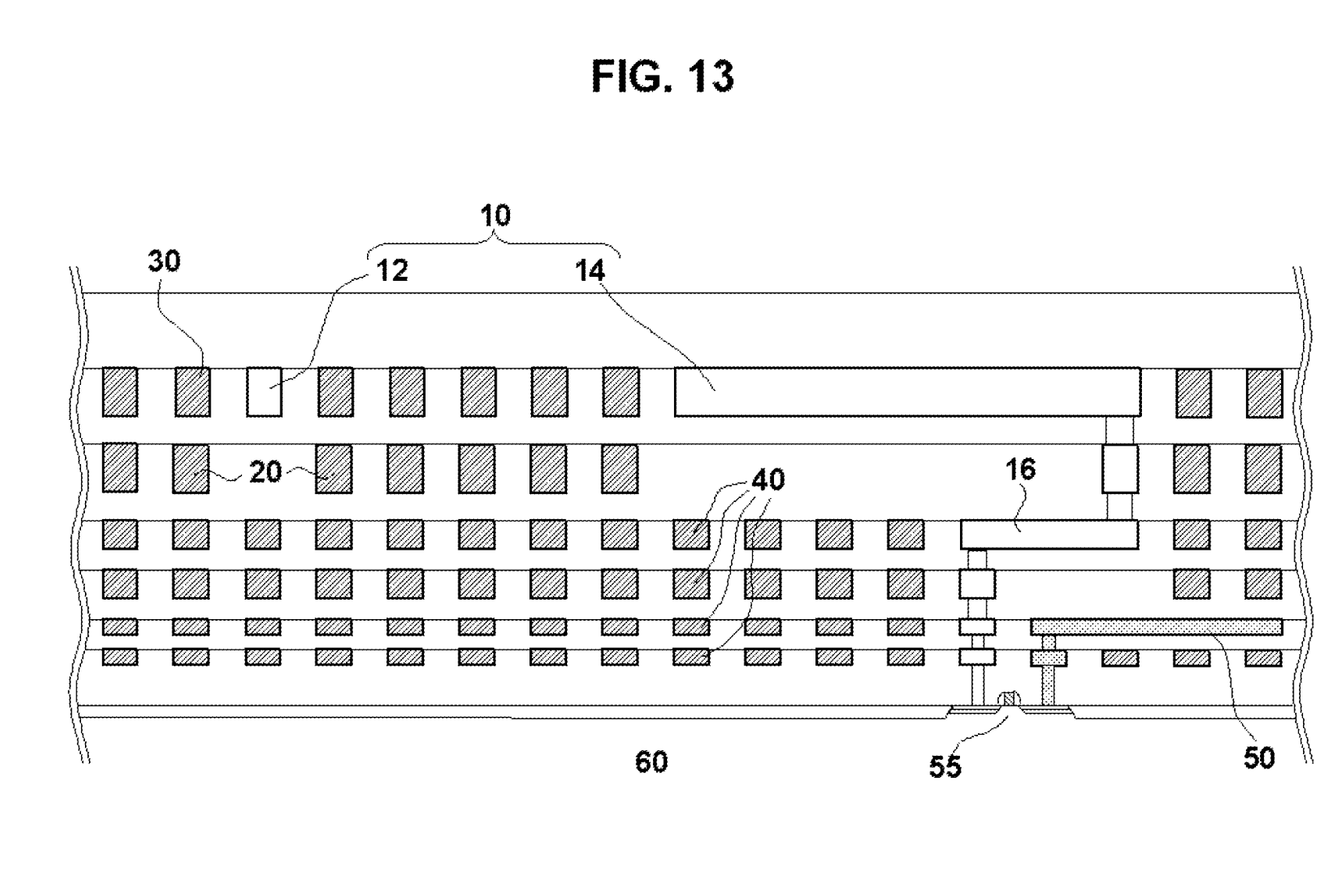
FIG. 13 is a cross-sectional diagram showing the semiconductor device according to a modified example of FIG. 12.

FIG. 13 is a cross-sectional diagram of the semiconductor device showing the semiconductor device according to a modified example of FIG. 12. The semiconductor device shown in FIG. 13 includes another high-frequency interconnect 16. The dummy conductor patterns are also disposed so as to keep away from a region overlapping the high-frequency interconnect 16.

What is claimed is:

1. A semiconductor device comprising:
a high-frequency interconnect disposed in a first layer in an interconnect layer;
a plurality of first dummy conductor patterns disposed in the interconnect layer; and
a plurality of second dummy conductor patterns disposed in a second layer which is different from the first layer in the interconnect layer,
wherein the second dummy conductor patterns are disposed so as to keep away from a region overlapping the high-frequency interconnect in a plan view,
wherein the high-frequency interconnect includes an inductor having a coil shape,
wherein the first dummy conductor patterns and the second dummy conductor patterns are formed on an inner side of a region surrounded by the high-frequency interconnect in a plan view such that the first dummy conductor patterns and the second dummy conductor patterns are overlapped, at least a part thereof, with each other, and
wherein the first dummy conductor patterns and the second dummy conductor patterns form an open circuit.

2. The semiconductor device according to claim 1, wherein the high-frequency interconnect is configured to permit flow of an electric current with a frequency of at least 5 GHz.

3. The semiconductor device according to claim 1, wherein the high-frequency interconnect comprises the inductor and an extraction interconnect that is electrically connected to the inductor.

4. The semiconductor device according to claim 1, wherein the second dummy conductor patterns are formed on both of the inner side and an outer side of the region surrounded by the high-frequency interconnect in the plan view.

5. The semiconductor device according to claim 1, wherein the second dummy conductor patterns are formed on both sides of the high-frequency interconnect in the plan view.

6. The semiconductor device according to claim 1, wherein the second layer abuts the first layer.

7. The semiconductor device according to claim 1, wherein the second layer is formed below the first layer, and
wherein a minimum value of a distance between each of the first dummy conductor patterns and the high-frequency interconnect is larger than a distance between a plain surface, which contains a top surface of each of the second dummy conductor patterns, and the high-frequency interconnect.

8. The semiconductor device according to claim 1, wherein:
the second layer is formed above the first layer; and
a minimum value of a distance between each of the first dummy conductor patterns and the high-frequency interconnect is larger than a distance between a plain surface, which contains a bottom surface of each of the second dummy conductor patterns, and the high-frequency interconnect.

9. The semiconductor device according to claim 1,
wherein a minimum value of a distance between each of the first dummy conductor patterns and the high-frequency interconnect is larger than a minimum value of a distance between each of the second dummy conductor patterns and the high-frequency interconnect.

10. The semiconductor device according to claim 1, further comprising:
a substrate; and
a transistor formed on the substrate,
wherein the interconnect layer is formed over the transistor.

11. The semiconductor device according to claim 1, wherein
the second dummy conductor patterns form an open circuit.

12. The semiconductor device according to claim 1,
wherein the second dummy conductor patterns are arranged in a form of dot pattern.

13. The semiconductor device according to claim 1, wherein
the second layer is formed below the first layer, and
a minimum value of a distance between each of the first dummy conductor patterns and the high-frequency interconnect is larger than a distance between a plain surface, which contains a top surface of each of the second dummy conductor patterns, and the high-frequency interconnect,
whereby eddy currents generated in the conductor patterns are suppressed.

14. The semiconductor device according to claim 13, wherein
the distance between the plain surface, which contains a top surface of each of the second dummy conductor patterns, and the high-frequency interconnect, is equal to a distance between a plain surface containing bottom surfaces of the dummy conductor patterns and the high frequency interconnect.

15. A semiconductor device comprising:
a high-frequency interconnect disposed in a first layer in an interconnect layer, the high-frequency interconnect being configured to conduct an electric current with a frequency of at least 5 GHz;
a plurality of first dummy conductor patterns disposed in the interconnect layer; and
a plurality of second dummy conductor patterns disposed in a second layer which is different from the first layer in the interconnect layer,
wherein the second dummy conductor patterns are disposed so as to keep away from a region overlapping the high-frequency interconnect in a plan view,
the high-frequency interconnect includes an inductor having a coil shape, the inductor being configured to generate a magnetic field,
the first dummy conductor patterns and the second dummy conductor patterns are formed on an inner side of a region surrounded by the high-frequency interconnect in a plan view such that the first dummy conductor patterns and the second dummy conductor patterns are overlapped, at least a part thereof, with each other,
the first dummy conductor patterns and the second dummy conductor patterns form an open circuit,
the second layer is formed below the first layer, and
a minimum value of a distance between each of the first dummy conductor patterns and the high-frequency interconnect is larger than a distance between a plain surface, which contains a top surface of each of the second dummy conductor patterns, and the high-frequency interconnect,
whereby eddy currents generated in the conductor patterns are suppressed.

16. The semiconductor device according to claim 15, wherein the high-frequency interconnect comprises the inductor and an extraction interconnect that is electrically connected to the inductor.

17. The semiconductor device according to claim 15, wherein the second dummy conductor patterns are formed on both of the inner side and an outer side of the region surrounded by the high-frequency interconnect in the plan view.

18. The semiconductor device according to claim 15,
wherein the second dummy conductor patterns are formed on both sides of the high-frequency interconnect in the plan view.

19. The semiconductor device according to claim 1, wherein
the second layer abuts the first layer.

20. A semiconductor device comprising:
a high-frequency interconnect disposed in a first layer in an interconnect layer, the high-frequency interconnect being configured to conduct an electric current with a frequency of at least 5 GHz;
a plurality of first dummy conductor patterns disposed in the interconnect layer; and
a plurality of second dummy conductor patterns disposed in a second layer which is different from the first layer in the interconnect layer, the first and second dummy conductor patterns being formed of a same damascened material as the high-frequency interconnect,
wherein the second dummy conductor patterns are disposed so as to keep away from a region overlapping the high-frequency interconnect in a plan view,
the high-frequency interconnect includes an inductor having a coil shape, the inductor being configured to generate a magnetic field,
the first dummy conductor patterns and the second dummy conductor patterns are formed on an inner side of a region surrounded by the high-frequency interconnect in a plan view such that the first dummy conductor patterns and the second dummy conductor patterns are overlapped, at least a part thereof, with each other,
the first dummy conductor patterns and the second dummy conductor patterns form an open circuit,
the second layer is formed below the first layer, and
a minimum value of a distance between each of the first dummy conductor patterns and the high-frequency interconnect is larger than a distance between a plain surface, which contains a top surface of each of the second dummy conductor patterns, and the high-frequency interconnect,
whereby eddy currents generated in the conductor patterns are suppressed.

* * * * *